United States Patent
Varak et al.

(10) Patent No.: US 8,375,793 B2
(45) Date of Patent: Feb. 19, 2013

(54) ACCELEROMETER FOR HIGH TEMPERATURE APPLICATIONS

(75) Inventors: Denis Varak, Chatsworth, CA (US); Pablo Ferreiro, Chatsworth, CA (US)

(73) Assignee: Dytran Instruments, Inc., Chatsworth, CA (US)

( * ) Notice: Subject to any disclaimer, the term of this patent is extended or adjusted under 35 U.S.C. 154(b) by 212 days.

(21) Appl. No.: 12/931,769

(22) Filed: Feb. 10, 2011

(65) Prior Publication Data
US 2012/0204644 A1 Aug. 16, 2012

(51) Int. Cl.
*G01P 15/09* (2006.01)
*H01L 41/22* (2006.01)
*H01L 41/053* (2006.01)

(52) U.S. Cl. ............ 73/514.34; 310/344; 29/25.35

(58) Field of Classification Search ........ 73/514.34, 73/514.16, 514.33, 514.29; 310/311, 326, 310/327, 340, 344; 29/25.35
See application file for complete search history.

(56) References Cited

U.S. PATENT DOCUMENTS

| | | | | | |
|---|---|---|---|---|---|
| 3,636,787 | A | * | 1/1972 | Nagafuchi et al. | 474/89 |
| 4,827,459 | A | * | 5/1989 | Franklin | 367/158 |
| 6,566,742 | B1 | * | 5/2003 | Matsumoto et al. | 257/678 |
| 7,219,550 | B2 | * | 5/2007 | Lau | 73/514.34 |
| 7,248,923 | B2 | * | 7/2007 | Maile et al. | 607/17 |
| 7,844,334 | B2 | * | 11/2010 | Maile et al. | 607/18 |

* cited by examiner

*Primary Examiner* — J M Saint Surin

(57) ABSTRACT

This invention is for a hermetic piezoelectric accelerometer sensor that can operates at high temperatures without the degradation observed on the piezoelectric elements, due to Oxygen depletion of the piezoelectric materials, when they are exposed to high temperatures, in reducing atmospheres, or low partial Oxygen pressure, inside a sealed housing. When a piezoelectric element loses Oxygen, becomes more electrically conductive, and this severe loss in resistivity, exacerbated with the increase of the temperature, makes the sensor inoperable, unreliable, or with permanent damage. The accelerometer of this invention operates effectively over a wide range of temperatures, including high temperatures above 1600° F., depending of the piezoelectric element used on the construction. The housing of the accelerometer uses a small section of metal made with Silver (or Silver alloys) to allow Oxygen diffusion through the metal, when it is exposed to high temperature. This permits that the construction of the accelerometer housing, can be sealed hermetically; and the piezoelectric elements of the sensor have increased lifetime, with enough partial pressure of Oxygen inside the housing.

20 Claims, 20 Drawing Sheets

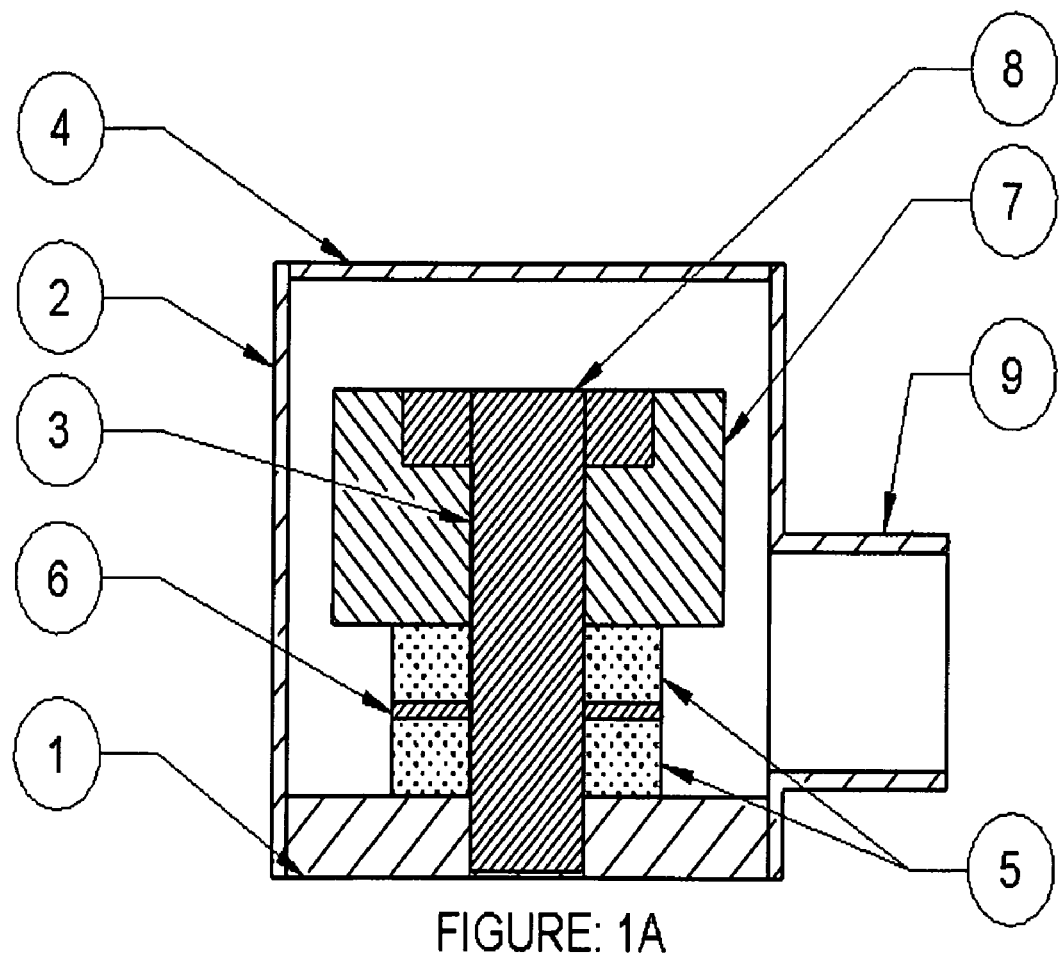
FIGURE: 1A

ACCELEROMETER FOR HIGH TEMPERATURE APPLICATIONS

FIELD OF INVENTION

This invention relates to accelerometers and piezoelectric sensors intended to be operational, on long life service, in a wide ranges of temperatures, including high temperatures over 1,600° F.

BACKGROUND OF THE INVENTION

Conventional piezoelectric accelerometers include a piezoelectric element, made with piezoelectric crystals or ceramic materials, that responds to stimuli from mechanical stresses exerted on their surfaces, by a seismic, or inertial mass; in direct proportion to external physical phenomena, like acceleration, pressure, or force, and other environmental stressors. Piezoelectric accelerometers can operate at wide ranges of temperature, and usually are divided in two groups; as known; charge mode and voltage mode. Charge mode accelerometers are high impedance units, that can operate at very high temperatures, limited by the construction materials and the physical limitations of the piezoelectric element. A charge mode accelerometer can be made to operate at temperatures above 1000° F. A charge mode accelerometer requires an external charge amplifier and other ancillary instrumentation for signal conditioning. Voltage mode accelerometers are low impedance units, which have their advantages with the instrumentation to process the signals from the sensor. However, limited on the maximum temperature of operation, by the electronic parts inside the unit. Usually, the maximum temperature for a unit with internal electronics is 325° F.

Accelerometers intended for high temperature of operation, from 400° F. up to 1,600° F., use special piezoelectric crystals, or piezoelectric ceramic materials, that can operates at those temperatures. Usually, piezoelectric crystals and ceramics, like Lithium Niobate, Langatate, Gallium Orthophosphate, Bismuth Titanate, modified Lead Titanate Zirconates, Lead meta Niobates, and others; are the materials of choice for high temperature applications, and not only in accelerometers, but any piezoelectric sensor using these, like ultrasonic sensors, for NDT [non destructive test], and for pressure, or force sensors. Piezoelectric materials develop an electric charge upon stress on an specific orientation, and this can be used to relate to a physical input. The main property of these piezoelectric materials [used in high impedance sensors] is that they are highly dielectric materials, and they should be like that, because, if not, when you develop an electric charge, it will dissipate through the material when it's electrically conductive. Therefore, piezoelectric materials have, and require to have, a very high resistivity; and the electronics used to read a meaningful signal, also requires that the piezoelectric element is highly resistive. In general, the piezoelectric materials will start to increase their electrical conductivity with the increase of the temperature. Examples of resistivity varies, from the Mega Ohms range, to drop to the Kilo Ohms range. Basically, for certain operational temperature a manageable value of around 100 k Ohms can be used. Standard practice uses the piezoelectric materials up to a temperature, just half, or a maximum of two thirds of the Curie temperature for the piezoelectric material. Above the Curie temperature the piezoelectric properties are lost permanently.

The majority of the piezoelectric materials, single crystals or ceramics, are oxides. This means that they are metals, or non metals, combined with Oxygen and oxidized by it. Moreover, the oxides of metals, in general are highly dielectric, or non electrically conductive, as opposed with metals that usually are electrically conductive or semiconductors. The bonding of Oxygen with different elements, or metals, have different strengths and stabilities. Some are very strong bonds, and cannot be reduced easily, like Silicon Dioxide, or very electropositive elements, like Lithium or Sodium with Oxygen. However, certain transition elements (metals) can be reduced to zero valence, metallic state, from the oxide, just by applying heat. Some of the piezoelectric materials, even in single crystal form, or ceramic; can be reduced slightly (less than stoichiometric), losing Oxygen, and becoming more electrically conductive by the increase of temperature. This undesirable property is exacerbated, when the piezoelectric material is in a reducing atmosphere, vacuum, sealed container, or with low partial pressure of Oxygen. When the Oxygen released by the piezoelectric material is reacting with other internal metal components of the sensor, the term Oxygen depletion is applied, because usually, it is permanently lost. The process is reversible, in general, therefore, if a source of Oxygen is applied to the internal parts of the sensor; it can be recovered.

Solutions adopted by the industry using these piezoelectric materials at high temperatures and in sealed containers (housings) are the following:

One simple solution to the Oxygen depletion proposed by many inventors in the prior art, is to keep the accelerometer or piezoelectric sensor vented with an opening to allow Oxygen from Air, to replace any Oxygen losses inside the sensor. Unfortunately, there are applications that requires a sensor to be hermetic, and impervious to the external environment. Manufacturers hide the venting hole, to be located at a non splashing location, but moisture and reactive gases can enter the housing and produce corrosion, or other internal damage on the sensor, even when it is not in operation. Plus, if the sensor is used in a reducing atmosphere, it won't matter if the sensor is vented; but necessary to be hermetic. An example of this type of solution is shown and described in U.S. Pat. No. 3,727,084.

A second approach of having a vent, but not fully open, is to use a porous metal aggregate, which allows to exchange gases between the interior and the exterior of the sensor. Unfortunately, the same implications discussed above for a non hermetic sensor are applicable, therefore is not a real solution for the Oxygen depletion problem. Moreover, the porous metal plug can get clogged eventually, terminating the benefit of the sought property. An example, of this type of solution is shown and described in U.S. Pat. No. 5,209,125.

Other researchers added inside the sensor a chemical that can release Oxygen to increase the partial pressure of Oxygen inside the unit. An example of a chemical that will release Oxygen when heated is Manganese Dioxide, taught also by U.S. Pat. No. 3,727,084 If the unit is hermetic to a level better than $1 \times 10^{-8}$ atmosphere*cc/sec, then the leakage is small enough to maintain the optimum performance of sensor for over 10 years, before the internal gases are exchanged with the external environment. Unfortunately, there are applications that cannot work properly with loose particles trapped inside the housing of the sensor. Accelerometers are design and made to work under vibration, and could release particles from the chemical itself, or the reactant left after the is Oxygen released. Same with ultrasonic probes, in which the high frequency of operation may disturb the layers of chemicals intended for oxygenation. Careful consideration during the design of the sensor may ameliorate the operational downsides.

Another technique to control the Oxygen depletion inside piezoelectric sensors is to backfill the housing with Oxygen, or enriched gases with Oxygen, or to have a path for Oxygen to interconnect the inside of the sensor housing in order to increase the partial pressure of Oxygen inside the sensor housing. Of course, again if the container or housing of the sensor is hermetic this will work. Unfortunately, the problem with this technique is that the sealing of housings in the sensor industry is typically made by laser welding or E-beam welding. Laser welding is performed at atmospheric pressure and can be backfill with different gases, but in pure Oxygen, or highly enrich environment of Oxygen will ignite the metal housing. E-Beam welding is performed under vacuum, and cannot be backfilled and sealed at the same time. Only a cold welding method will allow to backfill the sensor with Oxygen, however this technique will complicate the manufacturing process quite a bit. An example, of this type of solution is shown and described in U.S. Pat. No. 7,650,789.

Yet another technique to mitigate the Oxygen depletion of the piezoelectric materials is to pre-oxidize all internal components prior to seal. In theory, by pre-oxidizing all the internal parts of the sensor, they won't take Oxygen released by the piezoelectric materials. This is a factual statement, because if the materials from the housing or other components are been oxidized by Oxygen from the piezoelectric elements, then, this Oxygen will be loss permanently and the sensor not only, won't perform properly, but it will be damaged permanently. The pre-oxidation of the internal parts can be performed by actual oxidation of parts in Air at higher temperatures than normal operation, or by chemical passivation of the parts, both techniques have their merits and advantages. Unfortunately, this technique is necessary for the proper manufacturing of the sensors intended for high temperatures, but it won't correct the drop in resistivity on the piezoelectric elements, therefore, the sensor won't work correctly. This technique is not addressing the cause of the problem on the piezoelectric element, but one of the consequences. An example, of this type of solution is shown and described in U.S. Pat. Nos. 7,650,789 and 5,209,125.

Similarly, other researchers proposed to use noble metal liners on the inside of the housing of the sensor, in order to avoid taking free Oxygen released by the piezoelectric materials. Examples of this technique are the use of Platinum, Gold, and other metals that won't oxidize under the operational conditions of the sensor. Unfortunately, as with the previous technique, it won't address the issue of the loss of resistivity of the piezoelectric element.

In another proposed solution, researchers used diffusion barriers to avoid the release of Oxygen from the piezoelectric materials. There is some validity to this technique, but careful consideration of the chemistry of these barriers should be taken care also. The piezoelectric materials are highly dielectric and specific properties (electrical and mechanical) on them are sought, any diffusion barrier modifying these properties will be detrimental to the performance of the sensor. In some cases, a compromise of these properties can be obtained, then, this solution will be valid in those cases.

Some piezoelectric materials do not have the Oxygen depletion problem, like quartz, Gallium Orthophosphate, etc. However, quartz in the form of the most common form, alpha-quartz, can be use up to 500° F., when is clamped under stress inside the sensor, even when its phase transition (alpha-beta) occurs at 1063° F. Some researchers proposed to use beta-quartz, but this form is only stable over 1063° F., unless a high pressure. Unfortunately, quartz is a very poor conductor of heat, and sensors build with this material will be susceptible to thermal shock, which permanently damage the sensor. At these high temperatures quartz requires heating and cooling rates of around ten degrees per hour to avoid a destructive thermal shock. The material Gallium Orthophosphate is a new promising piezoelectric crystal, but it has the disadvantage of its very high cost, reduced availability with only two commercial vendors worldwide, and the material still not mature enough for the accelerometer and sensor market. As with quartz, this material will suffer with fast thermal shocks, plus the manufacturing technique is not well developed yet, to eliminate the excessive twining found on this material.

Besides working with the piezoelectric material issues at high temperature, there are other problems with the instrumentation required to obtain a meaningful signal from the piezoelectric sensors. A great deal of work was made in developing charge amplifiers that can take very low resistivity and still provide a proper response, corresponding to the external stimuli to the sensor. Unfortunately, the signal to noise ratio of any charge amplifier will be very low, when the resistivity of the piezoelectric material is changing a such larger magnitude (from ranges in the $10^7$ Ohms to $10^3$ Ohms). The signal will show more thermal noise, phase shifts, spikes, perturbations, etc.; than in normal conditions.

There are applications in superconductor material (metals oxides, similar to the piezoelectric materials) in which Oxygen stability on the compound matrix is the key factor in obtaining meaningful results at higher temperatures. Researchers in superconductors have to settle for lower temperature materials, due to fact, that Oxygen loses are less pronounced in these. An example, of this type of situation is shown and described in U.S. Pat. No. 5,972,845.

This invention provides an effective solution to overcome all the imperfections of the prior art.

SUMMARY OF THE INVENTION

It is therefore an object of the present invention to provide a hermetic piezoelectric sensor (accelerometer, pressure gauge, force load cell, ultrasonic tester, etc.) that can operates at wide ranges of temperature, and more specifically at high temperatures, from 400° F. up to 1,600° F., without the degradation of the piezoelectric material of the sensor, due to Oxygen depletion, inasmuch, low resistivity of the sensitive elements.

It is another object of the present invention to provide a hermetic piezoelectric sensor, for measuring: acceleration, pressure, force, ultrasonic testing, NDT's etc.; with improved longevity, better noise figures, and lower aging characteristics.

It is a further object of the present invention to provide a hermetic piezoelectric sensor more amicable to manufacturing processes, lower cost, and improved performance.

It is yet a further object of the present invention to provide oxygenation to internal parts of hermetic housings in all kinds of sensors, or enclosures, without vents, or chemicals, affected by lack of Oxygen, or that may require an increase in partial pressure of Oxygen.

An advantage of the present invention is that there is no degradation of the electrical and mechanical properties of piezoelectric materials used on sensors intended for applications at high temperature. Sensor will use simpler electronic circuitry, charge amplifier, and signal conditioner; plus obtain better performance of the sensor. Moreover, the sensor will be hermetically sealed, therefore, protected from the external environment, while having longer longevity and low aging of electrical properties.

This invention results from the realization of a oxygenation method of an enclosed environment by Oxygen diffusing through Silver metal activated at elevated temperatures. The degradation of piezoelectric materials at high temperature in reducing atmospheres, vacuum, or enclosed containers, is a well known process reported in the scientific literature. The main effect is the loss of Oxygen from the stoichiometric amount, to less than stoichiometric, and then low partial pressure of Oxygen presence, producing the displacement of the equilibrium to even less, plus free Oxygen reacting with the internal metal walls of the enclosure or with other parts of the assembly. Silver metal, and its alloys, have the property of allowing the permeation or diffusion of Oxygen through the metal at certain temperature of activation. Using this property, by making the whole housing or enclosure of Silver metal; or by making just enough size of a window on the mentioned housing or enclosure, made with Silver metal, a oxygenation process of the internal volume of the housing or enclosure can be performed.

The size of the Silver metal and the purity of its alloys is determined by the actual requirements of oxygenation needed. If the Silver thickness is too large, the process will take longer time to stabilize, when it is too thin, a loss in mechanical strength is obtained. Therefore, a compromise is reached on manufacturability, robustness, and time to obtain oxygenation in equilibrium is required for the sensor to operate within specifications. Silver alloys with high content of Silver work similarly, but typically, with lower temperature specifications, and slower Oxygen diffusion rates. Oxidation of the Silver, internal or externally to the housing, usually when the unit is not in use, or in storage, can be removed by heating up the unit to the operational temperature. Therefore, the use of Silver Oxide inside the sensor can be a source of Oxygen also.

Another advantage with the use a Silver window on the housing of the sensor is that allows to pre-treat the sensors, once they are hermetically sealed, in enriched Oxygen environment (from 25% to 100% Oxygen), at elevated temperature, enough to activate the Oxygen permeation. Because the accelerometers, or any other piezoelectric sensors, are hermetically sealed, the Oxygen pumped inside (once equilibrium is reached) will remain at enriched levels for long periods. Usually, the hermeticity level will determine the leakage of Oxygen to equalize the Oxygen in Air at some point in time, which still makes a good operable sensor at these level. Typically, at hermeticity levels below $1 \times 10^{-8}$ atm*cc/sec it will take ten years to exchange all gases trapped inside the sensor. This method won't have the disadvantages of sealing on Oxygen enriched environment and firing a laser welder during the process, discussed previously, on the background of the invention.

The scope of applications of this invention encompasses all sensors, instruments, and assemblies that are affected by the losses, depletion, permeation, diffusion, and/or ratio of Oxygen on the materials that are made of. Some examples are, but limited to, accelerometers, pressure sensors, force load cells, ultrasonics sensors, NDT's, superconductors, flow meters, etc.

BRIEF DESCRIPTION OF THE DRAWINGS

The foregoing and other objects, features, and advantages of this invention will be apparent from the following more particular description of a preferred embodiment of the invention, as illustrated in the accompanying drawings in which like reference characters refer to the same parts throughout the different views. The drawings are not necessarily made to scale, emphasis instead it is being placed on illustrating the principles of this invention. The preferred embodiment(s) of the present invention is/are described in conjunction with the associated drawings in which like features are indicated with like reference numerals and in which FIG. 1A is a side view in partial cross section of an typical accelerometer on compression mode.

DETAILED DESCRIPTION OF THE INVENTION

Figure 1B:
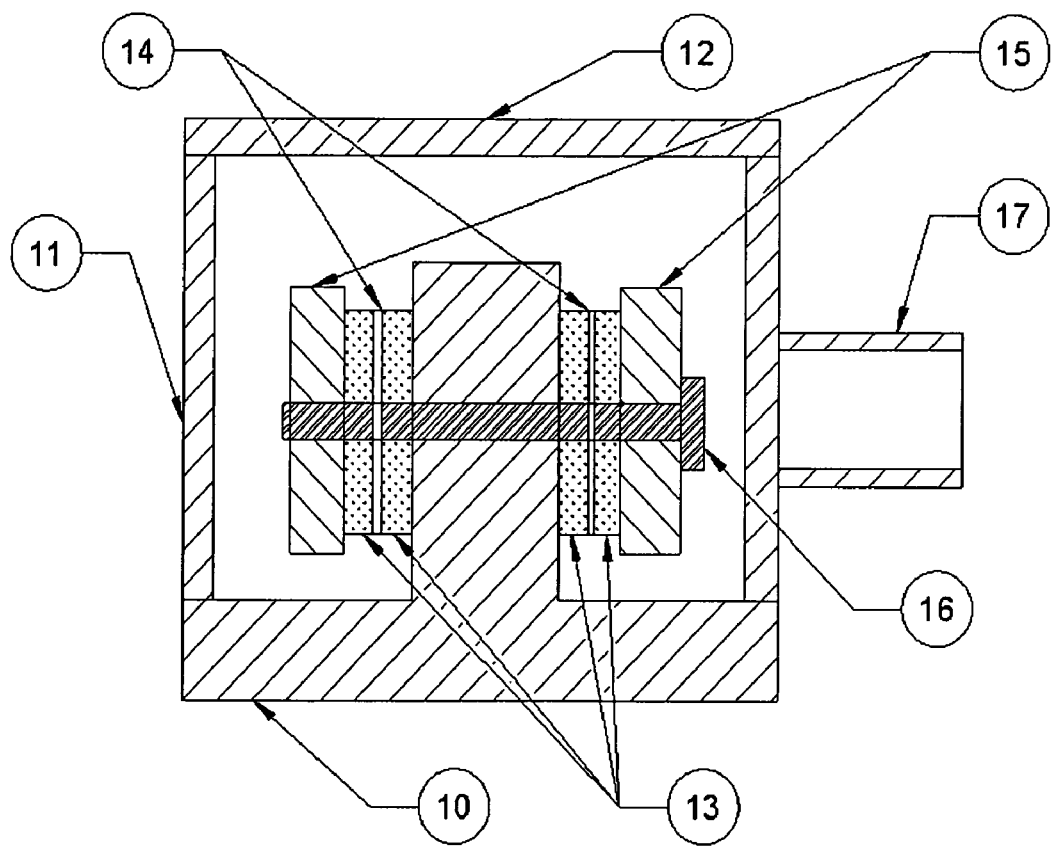
FIG. 1B is a side view in partial cross section of an typical accelerometer on shear mode.

The present invention utilizes a Silver metal window to compensate, and regulate the Oxygen equilibrium in hermetically sealed sensors. Said sensor in one of the preferred embodiments will measure acceleration, and includes a piezoelectric element which is susceptible to Oxygen partial pressure changes inside the sealed unit. All basic components of said sensor are pre-oxidized at a temperature higher than the intended operational temperature of the sensor. Further pre-conditioning can include Oxygen enrichment by exposing the sealed sensor to an enriched Oxygen environment, prior to operation on the field, at the factory. This is to reach the equilibrium faster in the case of Oxygen depletion of the piezoelectric elements. The Silver window given sufficient time will reach equilibrium of Oxygen depletion, as with the external atmosphere. However, if the external atmosphere is of different characteristics, or, of composed by reducing gases, the pre-conditioning of the internal parts by pre-oxidation, and the enriched Oxygen atmosphere are great improvements to allow extended lifetime to the sensor, due that the sensor is hermetic. While the description of the preferred embodiment is directed to a high temperature piezoelectric accelerometer sensor, it will be understood by one skilled in the art that the described accelerometer sensor can be used for all temperature applications including cryogenic applications. Besides, the operational temperature, also it is understood that a person having skills in the art can used different materials for the housing, electrodes, insulators, piezoelectric materials, connectors, and achieve the same results as described by the principles of this invention.

Referring now to FIG. 1A there is illustrated an accelerometer in compression mode comprising a housing formed partly by a base 1 and a case 2 providing a cylindrical hollow cavity and comprising a pair of piezoelectric sensing elements centered on a vertical post 3 projecting from the base into the cavity. The housing may be formed by a cylindrical parts (main structure) and a cap 4 on top, or as whole, as shown. The accelerometer is formed by an assembly of ceramic insulators (not shown), the piezoelectric elements 5, electrodes 6, seismic mass 7, a pre-load screw 8, and a connector 9. The accelerometer is rigidly secured by means of a screw to an object undergoing test. The accelerometer is designed to have an axis of maximum sensitivity parallel to the axis of the post and perpendicular to the base. The accelerometer will be described as if mounted to detect the component of acceleration along a vertical axis.

Referring now to FIG. 1B there is illustrated an accelerometer in shear mode comprising a housing formed partly by a base 10 and a case 11 providing a cubic hollow cavity and comprising several pairs of piezoelectric sensing elements centered on a horizontal post projecting from the base into the cavity. As with FIG. 1A, the housing can be formed with a main structure and a cap 12 on the top part. The accelerometer is formed by an assembly of ceramic insulators (not shown), the piezoelectric elements 13, electrodes 14, seismic masses 15, pre-load screw 16, and a connector 17. The accelerometer is rigidly secured by means of a screw to an object undergoing test. The accelerometer is designed to have an axis of maximum sensitivity parallel to the axis of the post and perpendicular to the base. The accelerometer will be described as if mounted to detect the component of acceleration along a vertical axis.

Figure 1C:
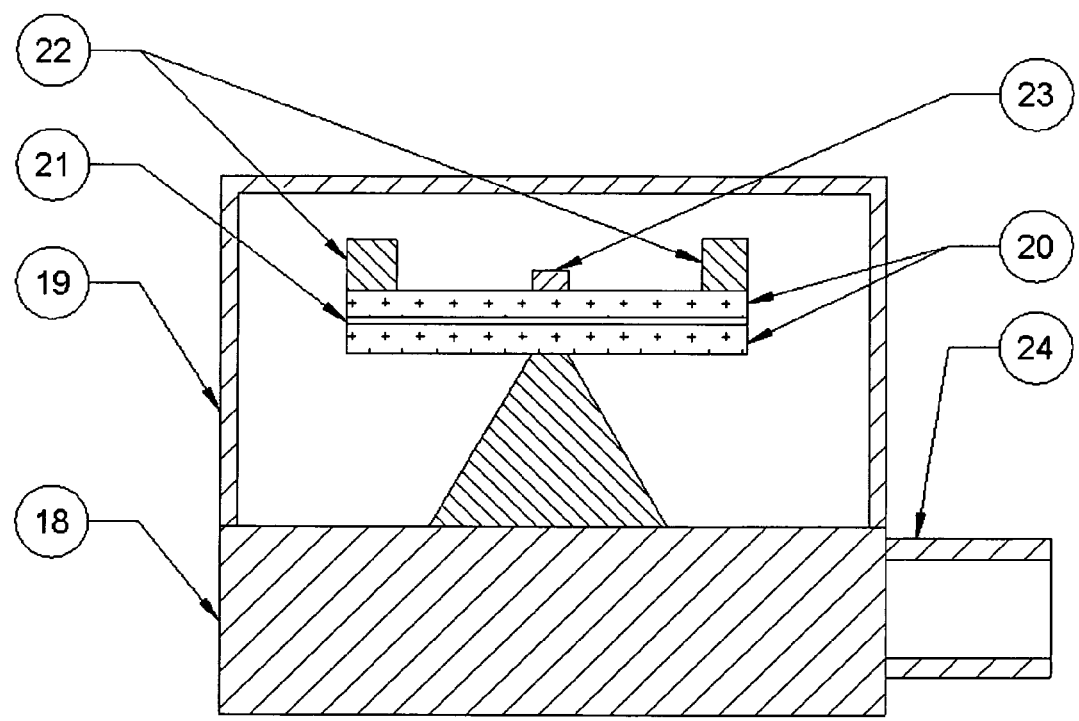
FIG. 1C is a side view in partial cross section of an typical accelerometer on flexural beam mode.

Referring now to FIG. 1C there is illustrated an accelerometer in compression mode comprising a housing formed partly by a base 18 and a case 19 providing a cylindrical hollow cavity and comprising a pair of piezoelectric sensing elements centered on a vertical post projecting from the base into the cavity. The accelerometer is formed by an assembly of a piezoelectric element in a beam mode (bimorph) 20, electrodes 21, seismic mass 22, a pre-load clamping screw 23, and a connector 24. The accelerometer is rigidly secured by means of a screw to an object undergoing test. The accelerometer is designed to have an axis of maximum sensitivity parallel to the axis of the post and perpendicular to the base. The accelerometer will be described as if mounted to detect the component of acceleration along a vertical axis.

Figure 2A:
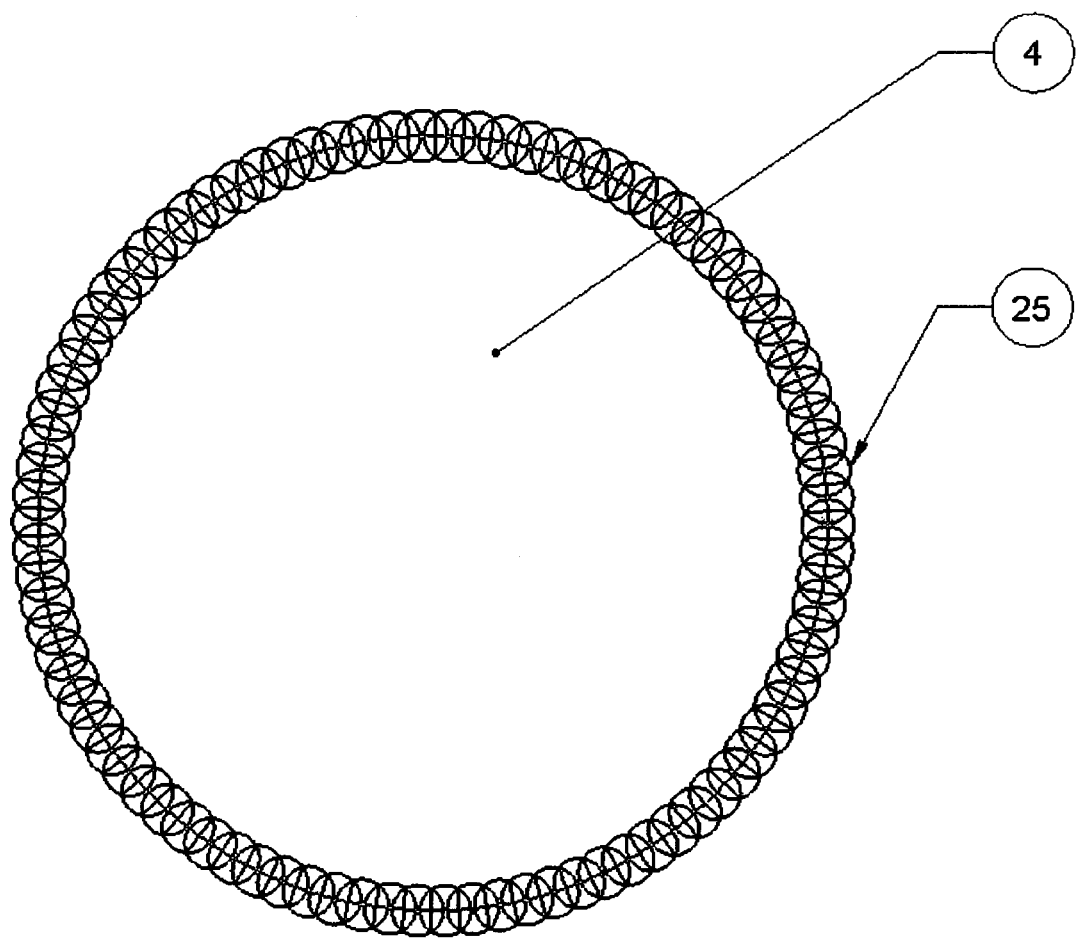
FIG. 2A is a top view of a first embodiment of the invention of the cap for the sensor made whole in Silver and welded through the outer edge diameter.
Figure 2B:
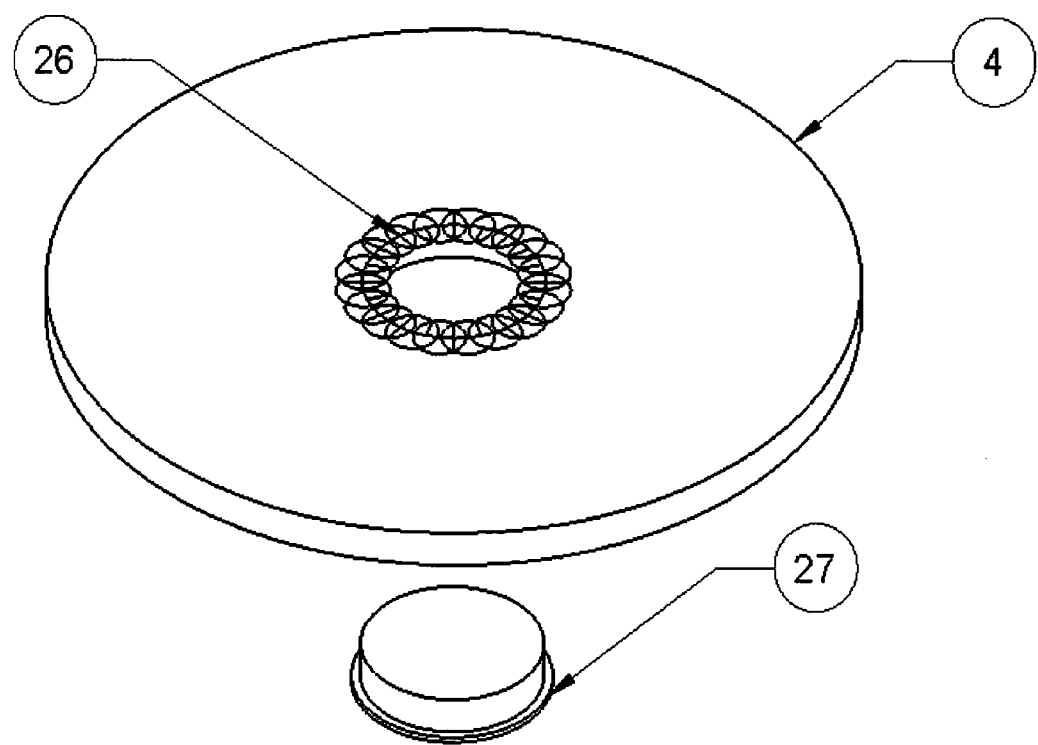
FIG. 2B is an isometric view of a second embodiment of the invention of the cap for the sensor with a center orifice plugged from inside with a Silver plug, and welded on the top.
Figure 2C:
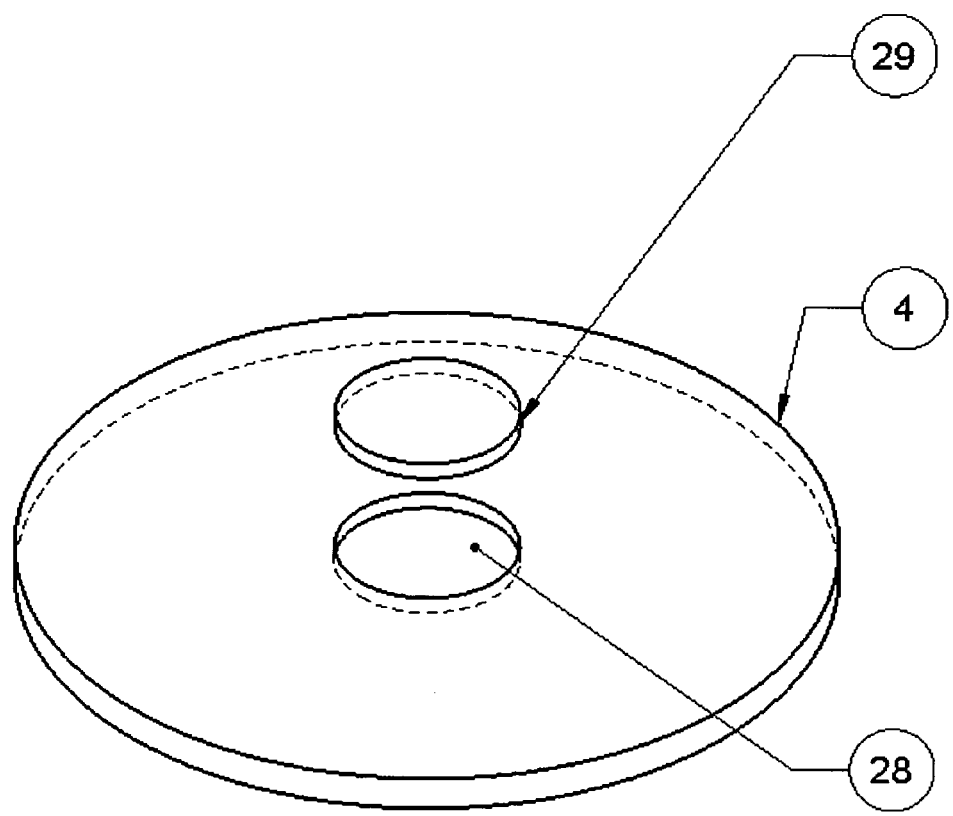
FIG. 2C is an isometric view of a third embodiment of the invention of the cap for the sensor with a section of its center replaced by Silver metal and welded or bonded by other means.
Figure 2D:
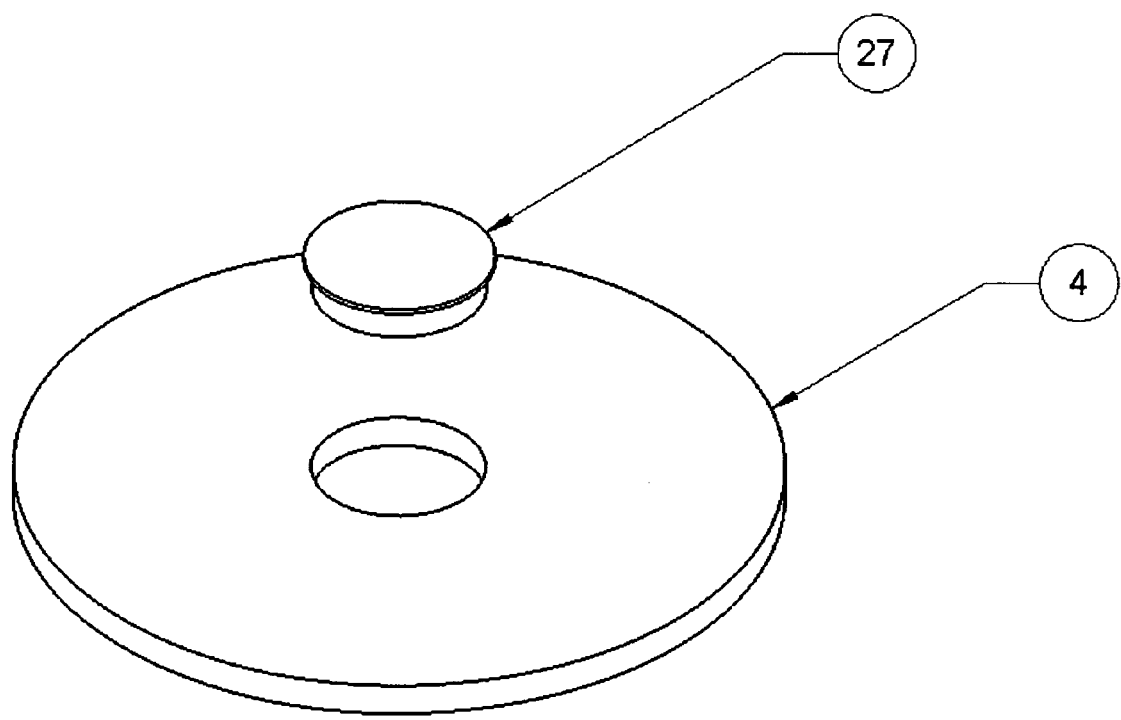
FIG. 2D is an isometric view of a fourth embodiment of the invention of the cap for the sensor in which the center orifice is sealed from the top with a Silver piece by applying pressure to it.
Figure 2E:
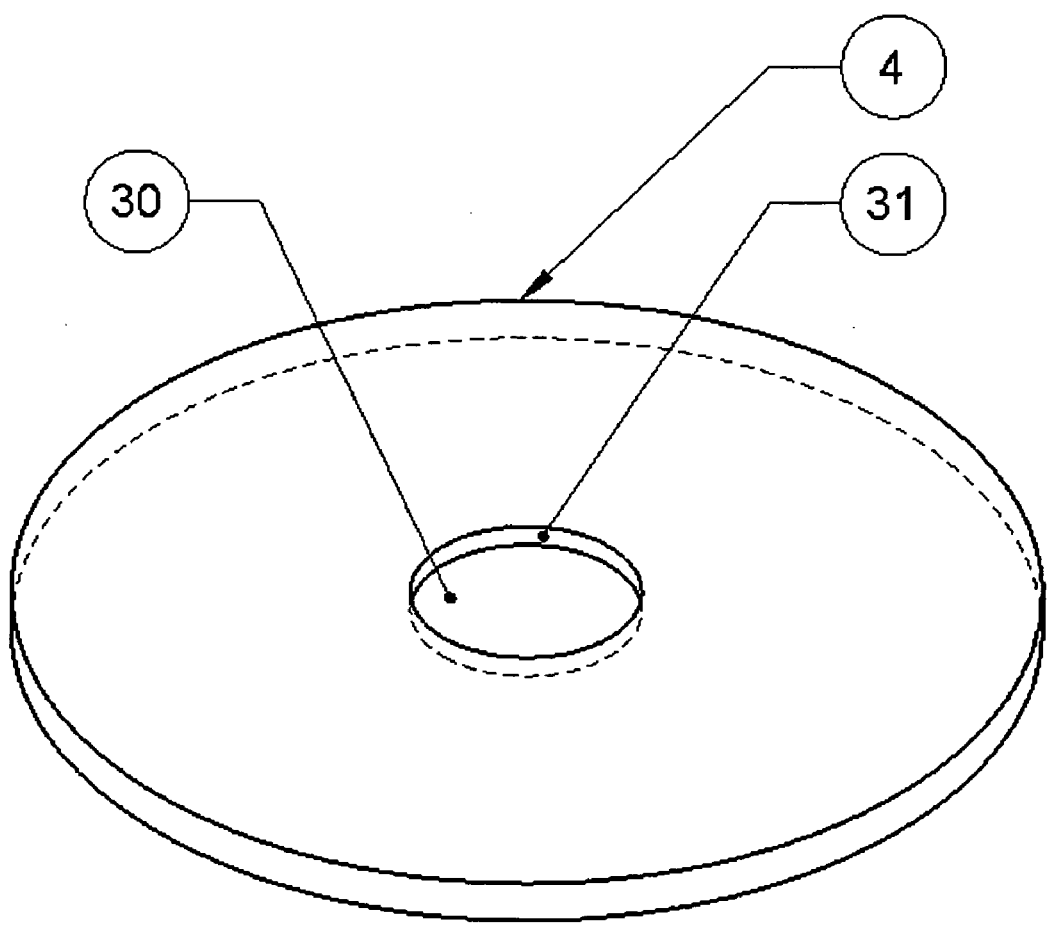
FIG. 2E is an isometric view of a fifth embodiment of the invention of the cap for the sensor with a recessed center orifice allowing the melting or brazing of a Silver center nugget or piece on it, then sealing said orifice.

Referring now to FIGS. 2A, 2B, 2C, 2D, and 2E; there are more details drawings on several embodiments of the cap with the proposed Silver window. The cap can be integral part of the housing, or a separated weldable part to it. The shape of the cap can varies according to the topology of the sensor, these drawings are showing only one of the preferred shapes, inasmuch with different forms of attaching the Silver window, maintaining the same principle of usefulness of the Silver window. In FIG. 2A is shown the whole cap 4 made in Silver metal and welded through the edge 25 of the cap to the housing (not shown). In another embodiment FIG. 2B the cap 4 has a center hole 26 which is plugged from the inside with a Silver plug 27. It is understood that the bottom of the cap will face the internal part of the sensor when the cap is welded. In FIG. 2C is shown a cap with a missing center part 28, which is entirely replaced by a Silver metal part 29 of the precise dimensions of the missing center of the cap. This can be welded, or bonded by other means. In FIG. 2D is shown a cap 4 with a center hole which is plug from the outside (top part) with a proper Silver metal plug 27, by applying pressure to the Silver metal and deforming the same to make a adequate seal. After setting the plug, this can be welded or bonded by other means. Usually Silver is easily deformed in comparison with most metals. It is understood that the composition of the cap is hardest than the Silver metal plug. In FIG. 2E the cap 4 has a recessed area 30 in which a matching part made with Silver metal can be melted in place 31.

Figure 3A:
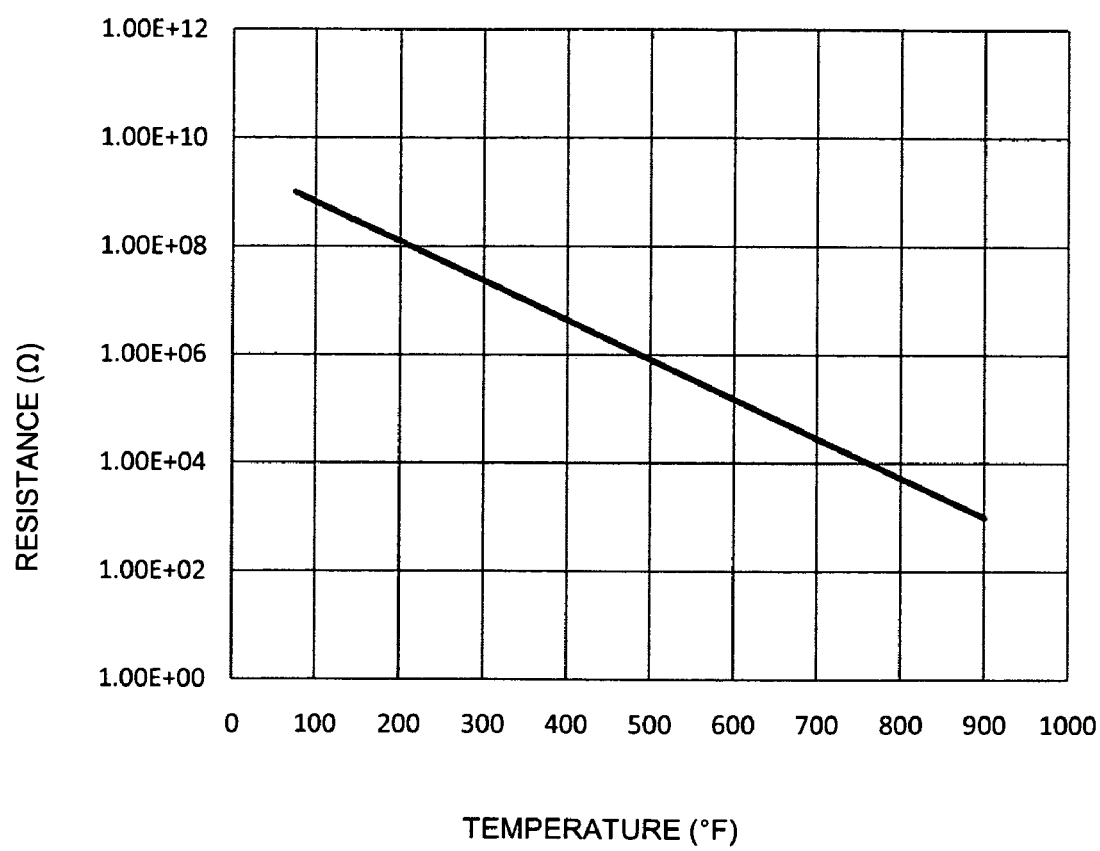
FIG. 3A is a typical plot of the resistivity over temperature in a sealed sensor where Oxygen depletion is encountered.
Figure 3B:
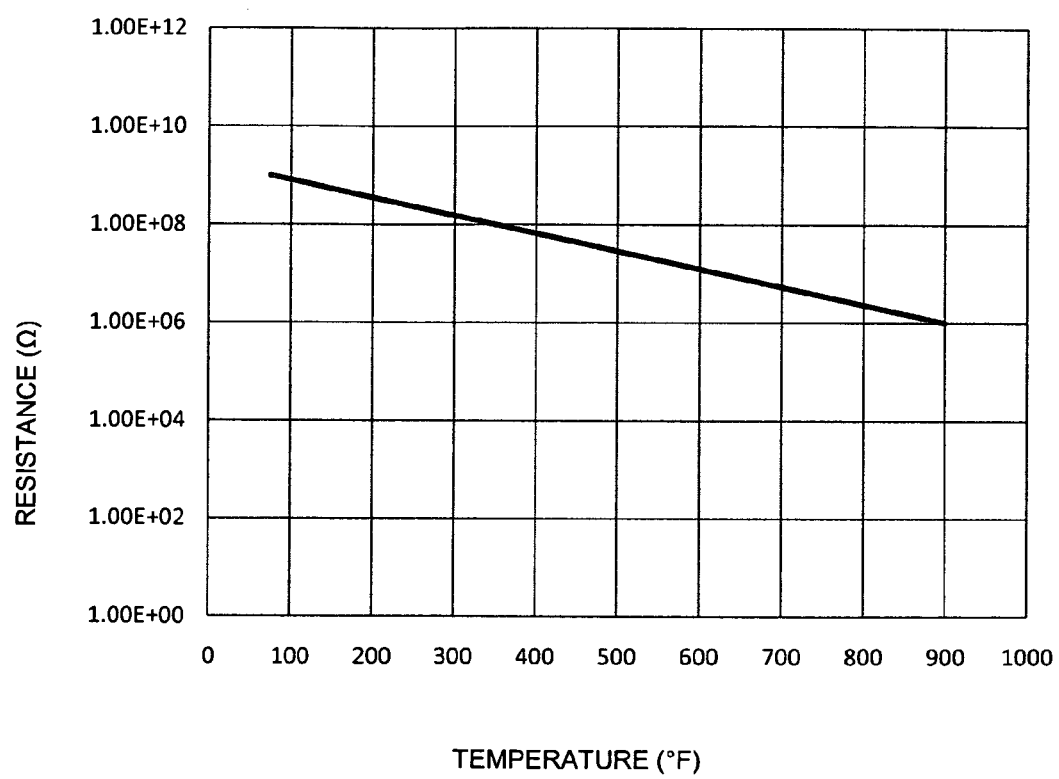
FIG. 3B is a typical plot of the resistivity over temperature in a sealed sensor where no Oxygen depletion is encountered, due to a Silver window that was installed on the sensor.
Figure 3C:
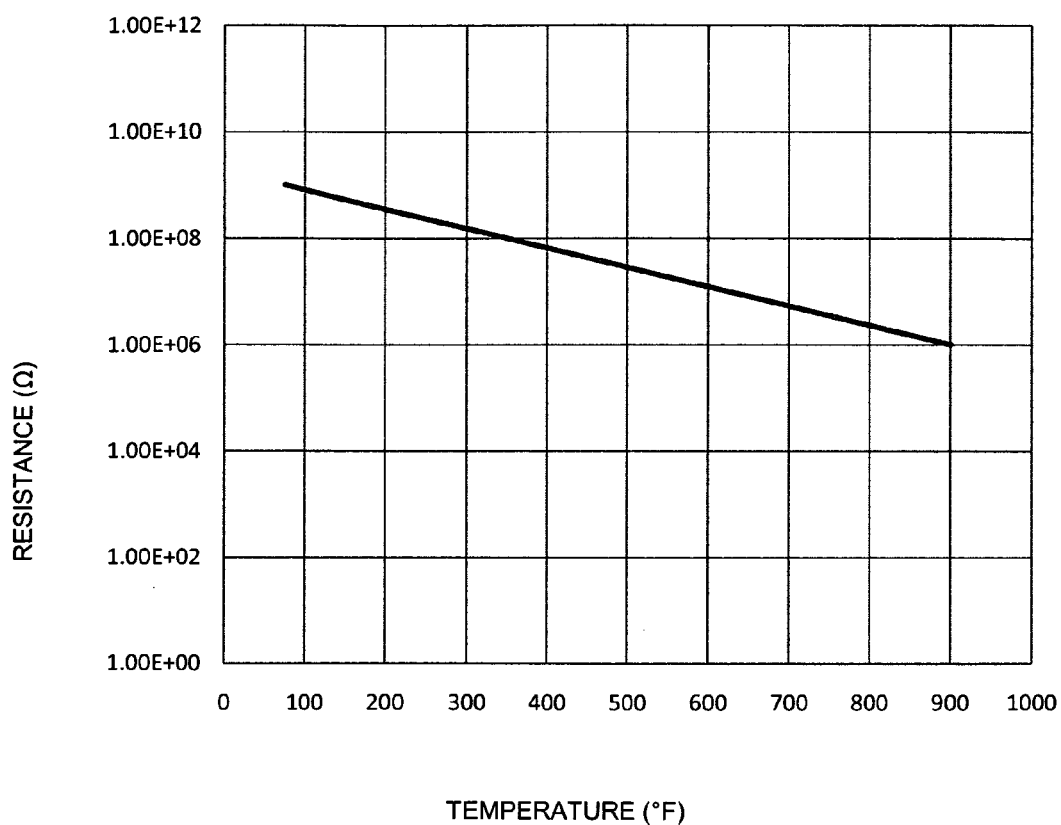
FIG. 3C is a typical plot of the resistivity over temperature in an open to Air sensor where no Oxygen depletion is encountered, due to the sufficient availability of Oxygen.

Referring now to FIG. 3A there is illustrated a typical plot of the electrical resistivity change against temperature of a hermetically sealed unit. Electrical resistivity is measured across the piezoelectric elements in the assembly. Piezoelectric elements affected by Oxygen depletion inside an enclosure without gases exchange with the outer atmosphere will lose resistivity drastically with the increase of temperature. In this plot, it is observed that from a resistivity at room temperature of 100 Mega Ohms, the unit will drop as low as 300 Ohms at operational temperature of the sensor of 900° F. Special charge amplifiers intended for remote use and high temperature accelerometers cannot work properly below 10,000 Ohms, plus that the noise level of the signal is also increased. Typical charge amplifiers for this application are usable to a maximum of 100,000 Ohms. In FIG. 3B there is illustrated the plot for the same unit used on FIG. 3A, but a Silver window installed. We can observe from the plot that the resistivity drop reached a minimum value of around 800 kilo Ohms at operational temperature of 900° F. In FIG. 3C is shown the same unit, but vented in Air; we can observe that the plot is quite similar to the one in FIG. 3B using a Silver window. In conclusion, the resistivity behavior of the piezoelectric accelerometer using Silver window, or vented in Air are the same, therefore, the use of a Silver window is equivalent to have the unit open and exposed completely to Air. The clear advantage is that the unit with a Silver window is hermetically sealed, and impervious to other detrimental conditions that an open sensor can encounter on the field.

Figure 4A:
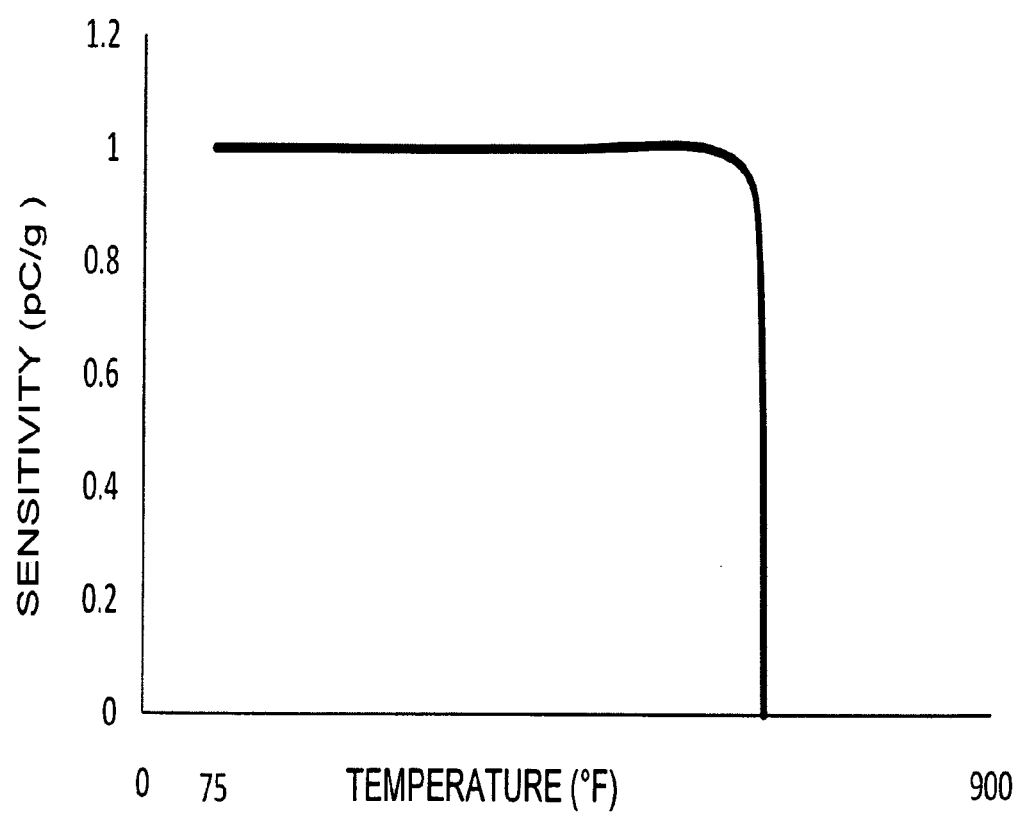
FIG. 4A is a typical plot of the sensitivity over temperature in a sealed sensor where Oxygen depletion is encountered.
Figure 4B:
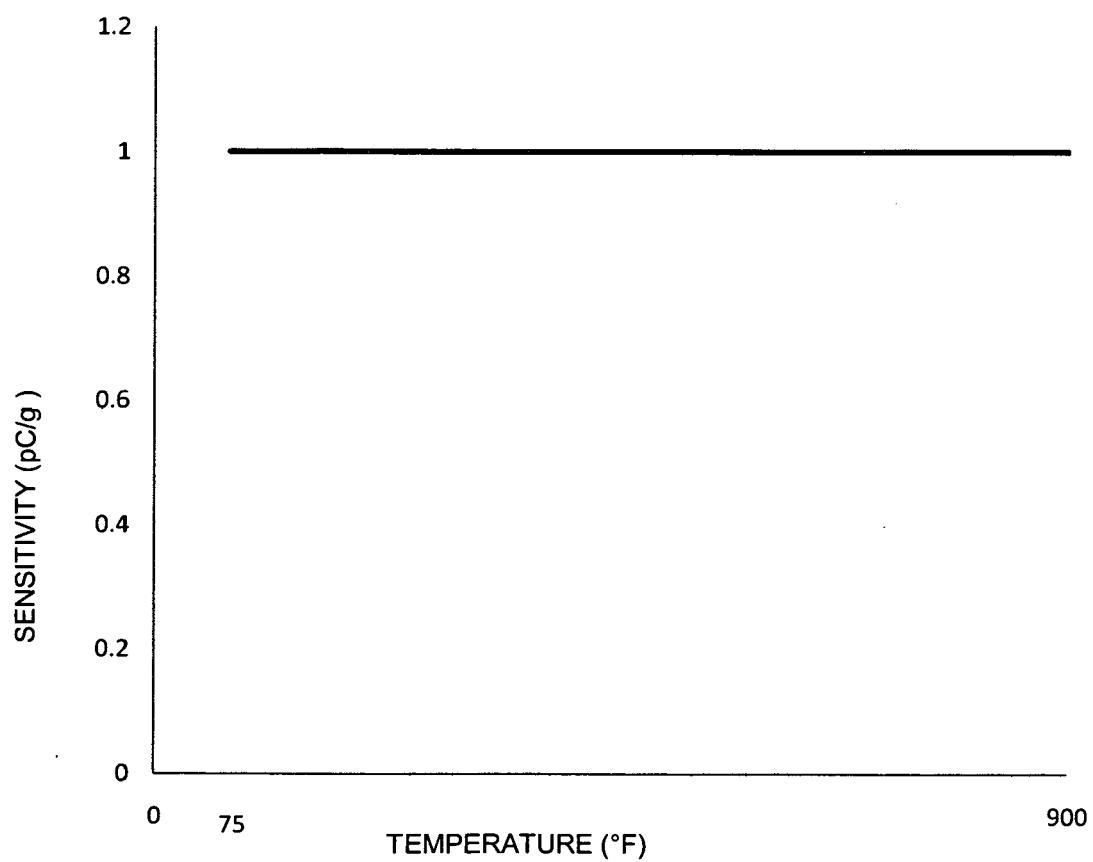
FIG. 4B is a typical plot of the sensitivity over temperature in a sealed sensor where no Oxygen depletion is encountered, due to a Silver window that was installed on the sensor.
Figure 4C:
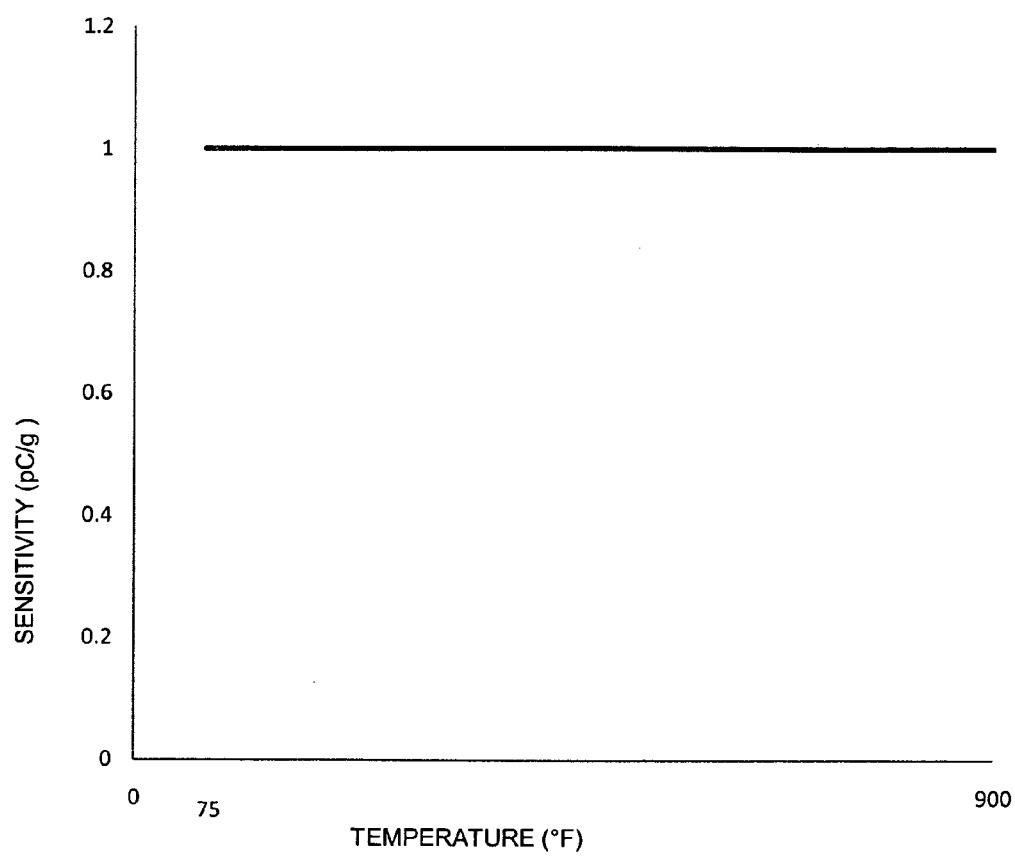
FIG. 4C is a typical plot of the sensitivity over temperature in an open to Air sensor where no Oxygen depletion is encountered, due to the sufficient availability of Oxygen.

In the above results, we found a great improvement of the resistivity drop that piezoelectric elements will have by using a Silver window in a hermetic model, or by full exposure to Air in a vented model (non hermetic). In a further continuation of the analysis of the behavior of a typical accelerometer unit suffering of Oxygen depletion, now we refer to FIG. 4A in which is illustrated the sensitivity of the sensor change against temperature in a sealed unit. We observed that the unit has a nominal value of 1 pC/g at room temperature, and slightly up to at 500° F., but then suddenly after 600° F., the signal is becoming noisier, and then drop to zero, when the charge amplifier cannot handle the low resistivity of the piezoelectric elements. There is no permanent damage to the sensor at this point, the problem is that the instrumentation to read the signal coming from the sensor is not adequate to read it. If the sensor is vented to Air (Oxygen in Air is 21% in volume), it will reverse the Oxygen depletion and the sensor will come back to life. In some occasions the sensor could be permanently damaged. In FIG. 4B we observe the same sensor, but with a Silver window installed. The sensitivity changes are within normal behavior for the piezoelectric element at the operational temperature. Same as above, the plot shown in FIG. 4C of the same unit open to Air, showed a similar behavior as the one in FIG. 4B using a Silver window.

Figure 5:
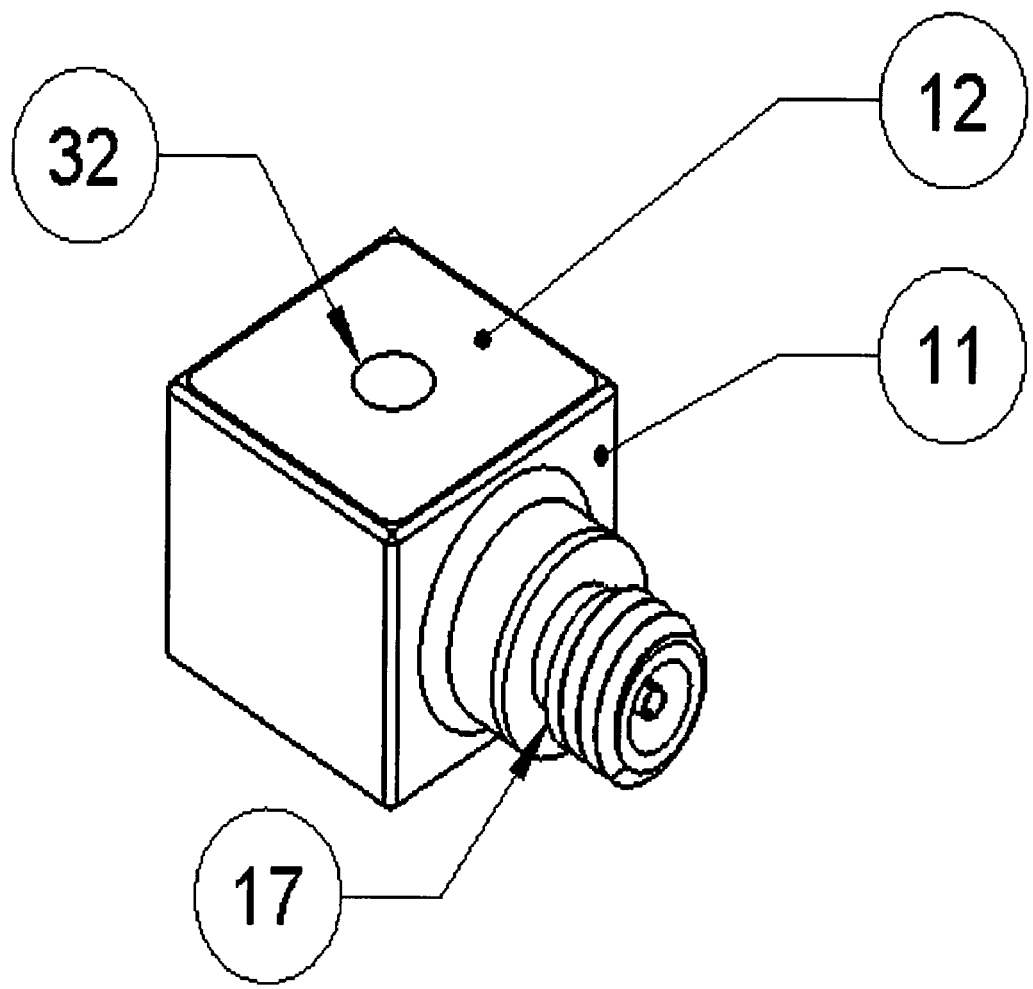
FIG. 5 is an isometric view of an exemplary piezoelectric accelerometer sensor with the Silver window on top.

In the preferred embodiment shown in FIG. 5, the sensor housing 11 is fabricated in a cubic shape for a shear mode accelerometer, with an external connector 17, in which the cap 12 on the top of the sensor has a Silver window 32 installed. This sensor uses piezoelectric elements made with Lithium Niobate single crystal with a Curie temperature of 2,100° F., and usable up to a temperature of 1,000° F. due to limitations on the external connector, but not on the piezoelectric elements. Housing is made in Inconel® 600 alloy, and proper Stainless Steel electrodes made for the adequate temperature compensation. Element assembly is connected to the ground, therefore, insulators are not required on this embodiment. In one practice of this embodiment for this invention, the entire sensor assembly was heated to a temperature approximately 1050° F., and maintained for 48 hours while the interior of the assembly was vented to the atmosphere. This sensor is hermetically sealed to a level better than $1 \times 10^{-8}$ atmosphere*cc/sec in Helium.

Figure 6:
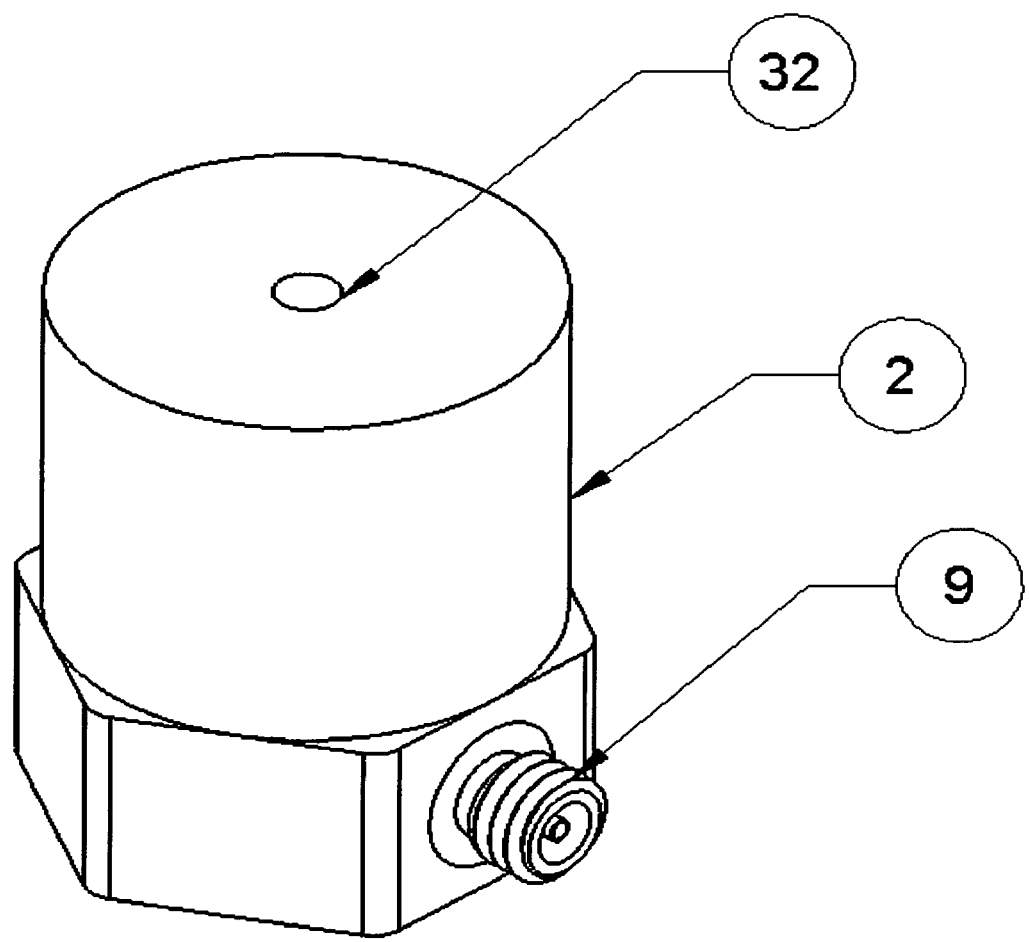
FIG. 6 is an isometric view of another exemplary piezoelectric accelerometer sensor with the Silver window on top.

In another preferred embodiment shown in FIG. 6, the sensor housing 2 is fabricated in a cylindrical shape for a compression mode accelerometer, with an external connector 9, again the cap of the housing has a Silver window 32 installed. This sensor uses piezoelectric elements made with ferroelectric ceramics of Aurivillius type, Bismuth Titanate doped with Sodium, with a Curie temperature of 1,202° F., and usable up to 900° F. Housing is made on Inconel® 600 alloy. Same as above, the element assembly is connected to ground, however, insulators are used, but for the temperature compensation of the expansion for the different elements of the assembly. In one practice of this embodiment for this invention, the entire sensor assembly was heated to a temperature approximately 950° F., and maintained for 48 hours while the interior of the assembly was vented to the atmosphere. This sensor is hermetically sealed to a level better than $1 \times 10^{-8}$ atmosphere*cc/sec in Helium.

Figure 7:
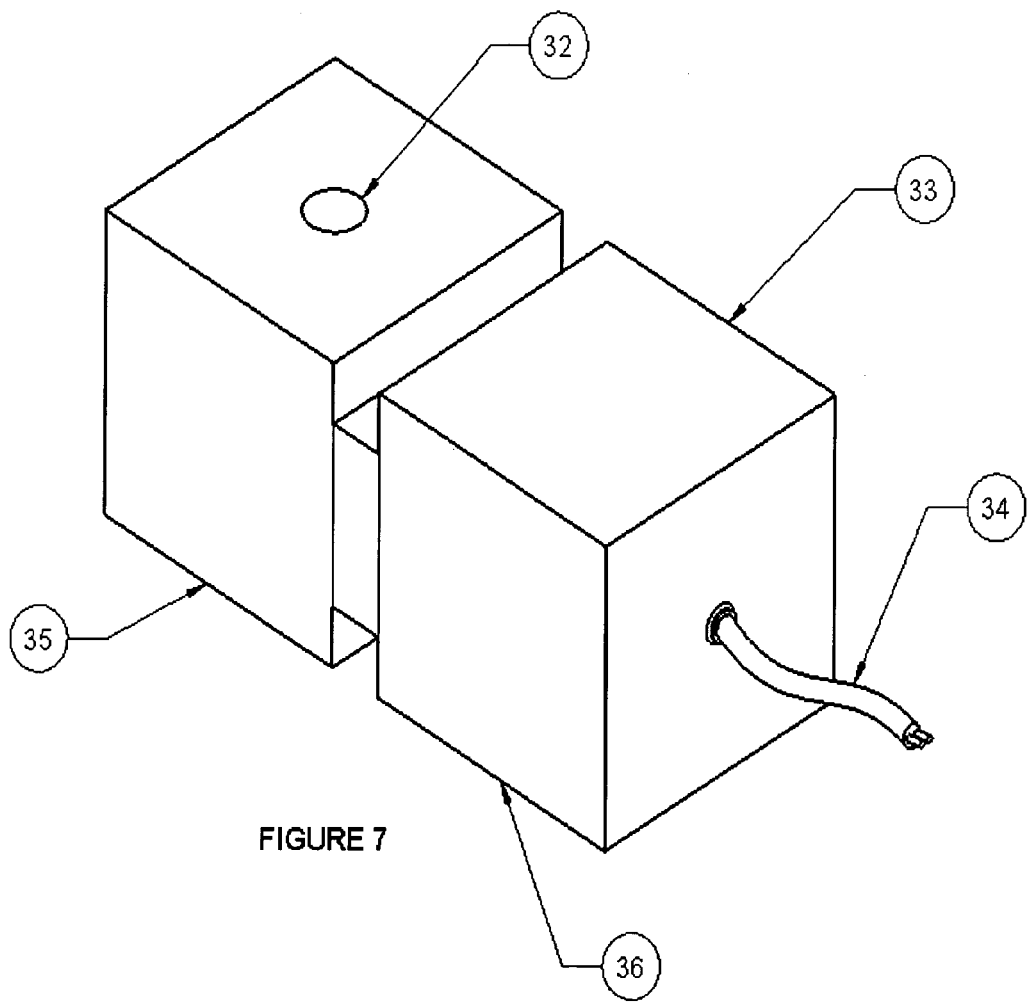
FIG. 7 is an isometric view of further exemplary piezoelectric accelerometer sensor with the Silver window on top.

In a further preferred embodiment shown in FIG. 7, the sensor housing 33 is fabricated in a rectangular shape for a shear mode accelerometer, with an integral hard line cable 34 attached to the housing. It can be observed that a Silver window 32 was installed on the top part of the housing. There are two separated areas on the sensor, one for the sensor itself 35, and the second one for the cable assembly 36. This sensor is off ground, utilizing two isolated wires on the hard line cable and proper insulators on the piezoelectric elements to isolate these from the housing and base of the sensor. This sensor uses piezoelectric elements made with Lithium Niobate single crystal, that as described above, has a Curie temperature of 2,100° F., and due to the sensor configuration it can be used up to 1,600° F. Said sensor housing and cable assembly are made in Inconel® 600 alloy. Hard line cable uses Silicon Dioxide mineral insulator, and conductor core made with Inconel® 600 alloy. In one practice of this embodiment for this invention, the entire sensor assembly was heated to a temperature approximately 1650° F., and maintained for 48 hours while the interior of the assembly was vented to the atmosphere. This sensor is hermetically sealed to a level better than $1 \times 10^{-8}$ atmosphere*cc/sec in Helium.

Figure 8:
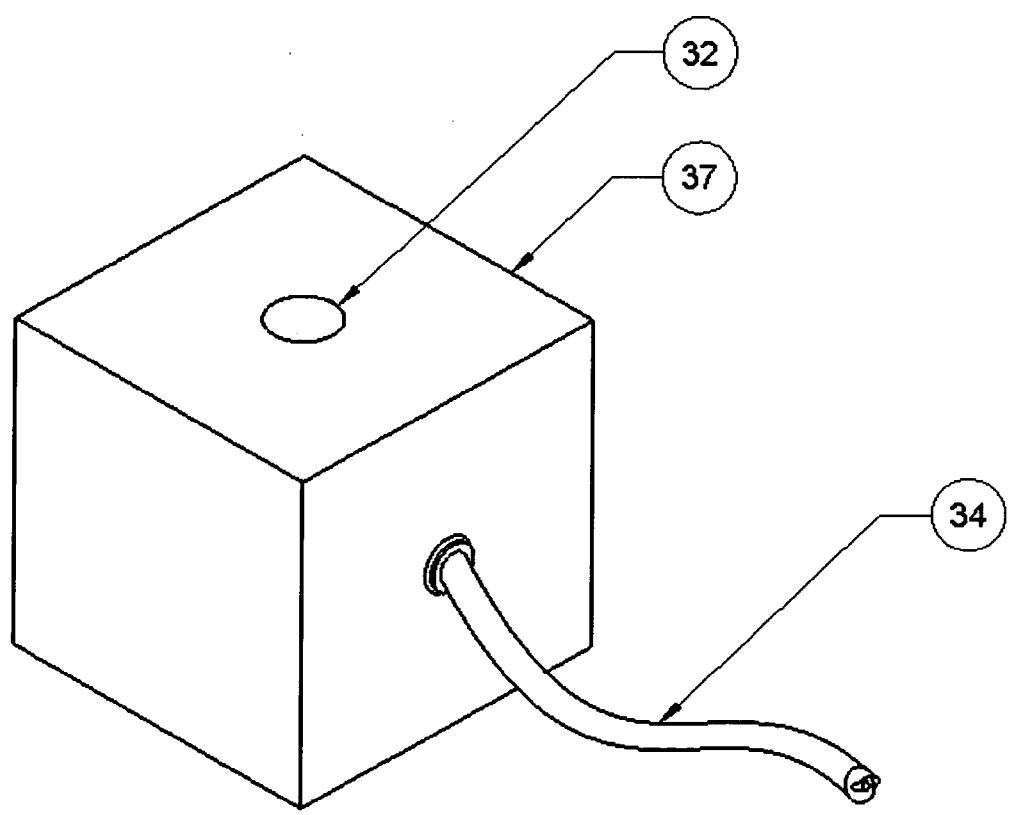
FIG. 8 is an isometric view of yet a further exemplary piezoelectric accelerometer sensor with the Silver window on top.

In a another preferred embodiment shown in FIG. 8, the sensor housing 37 is fabricated in a cubic shape for a shear mode accelerometer, with an integral hard line cable 34 attached to the housing. It can be observed that a Silver window 32 was installed on the top part of the housing. This sensor is off ground, utilizing two isolated wires on the hard line cable and proper insulators on the piezoelectric elements to isolate these from the housing and base of the sensor. This sensor also uses piezoelectric elements made with Lithium Niobate single crystal, that as described above, has a Curie temperature of 2,100° F., and due to the sensor configuration it can be used up to 1,600° F. Said sensor housing and cable assembly are made in Inconel® 600 alloy. Hard line cable uses Silicon Dioxide mineral insulator, and conductor core made with Inconel® 600 alloy. In one practice of this embodiment for this invention, the entire sensor assembly was heated to a temperature approximately 1650° F., and maintained for 48 hours while the interior of the assembly was vented to the atmosphere. This sensor is hermetically sealed to a level better than $1 \times 10^{-8}$ atmosphere*cc/sec in Helium.

Figure 9:
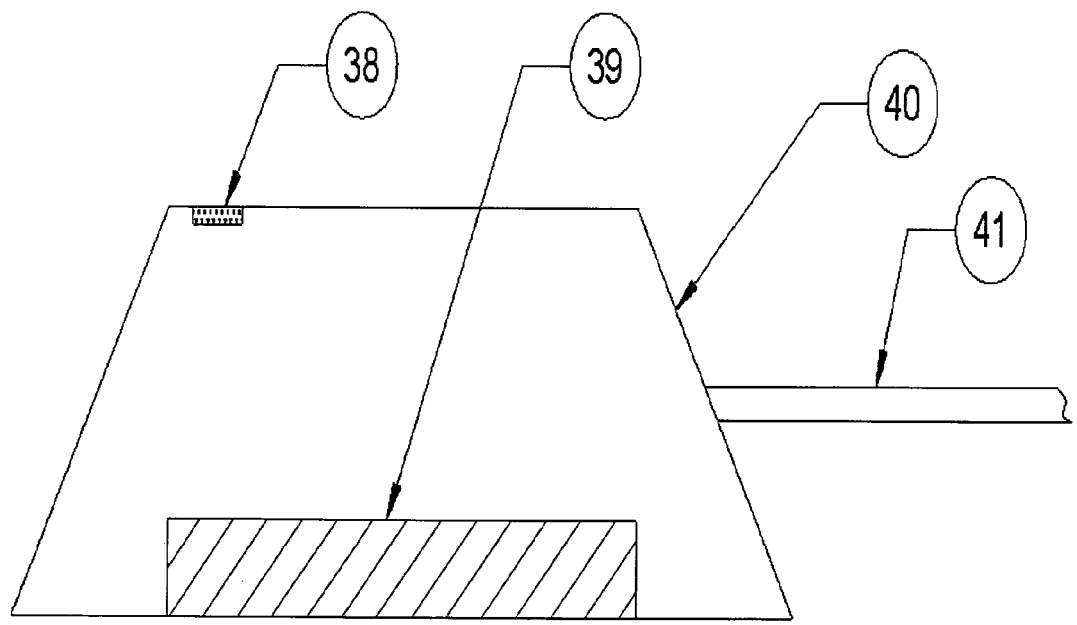
FIG. 9 is a side view in partial cross section of an exemplary piezoelectric ultrasonic NDT sensor with the Silver window on top.

In another embodiment of this invention shown in FIG. 9, a high temperature NDT ultrasonic sensor using piezoelectric crystals has a Silver window 38 on the top of the sensor housing. This sensor measures ultrasonic frequency responses of metal or ceramic structures under test at high temperatures. Piezoelectric elements 39 for this invention are Tungsten-Bronze types, which have low acoustic impedances, like Lead meta Niobates; and/or Aurivillius types, like Bismuth Titanates. Both materials are susceptible to Oxygen depletion in sealed environments. Oxygen depletion is a huge factor in the performance of the sensor, and the Silver window on the top of the sensor allows to keep an adequate level of Oxygen partial pressure to proper operation. Housing 40 is made with Stainless steel 304L, and the whole housing and base is off ground, therefore, a hard line cable 41 made with two isolated electrically conductor cores that are attached to the element assembly and the housing. Both cores are isolated with mineral oxides, like Magnesium Oxide, or Silicon Dioxide. In one practice of this embodiment for this invention, the entire sensor assembly was heated to a temperature approximately 1000° F., and maintained for 48 hours while the interior of the assembly was vented to the atmosphere. This sensor is hermetically sealed to a level better than $1 \times 10^{-8}$ atmosphere*cc/sec in Helium. NDT sensors suitable to work up to 1,600° F. can be fabricated with slight modifications to this technique, and minute changes on the housing materials and processing steps.

Figure 10:
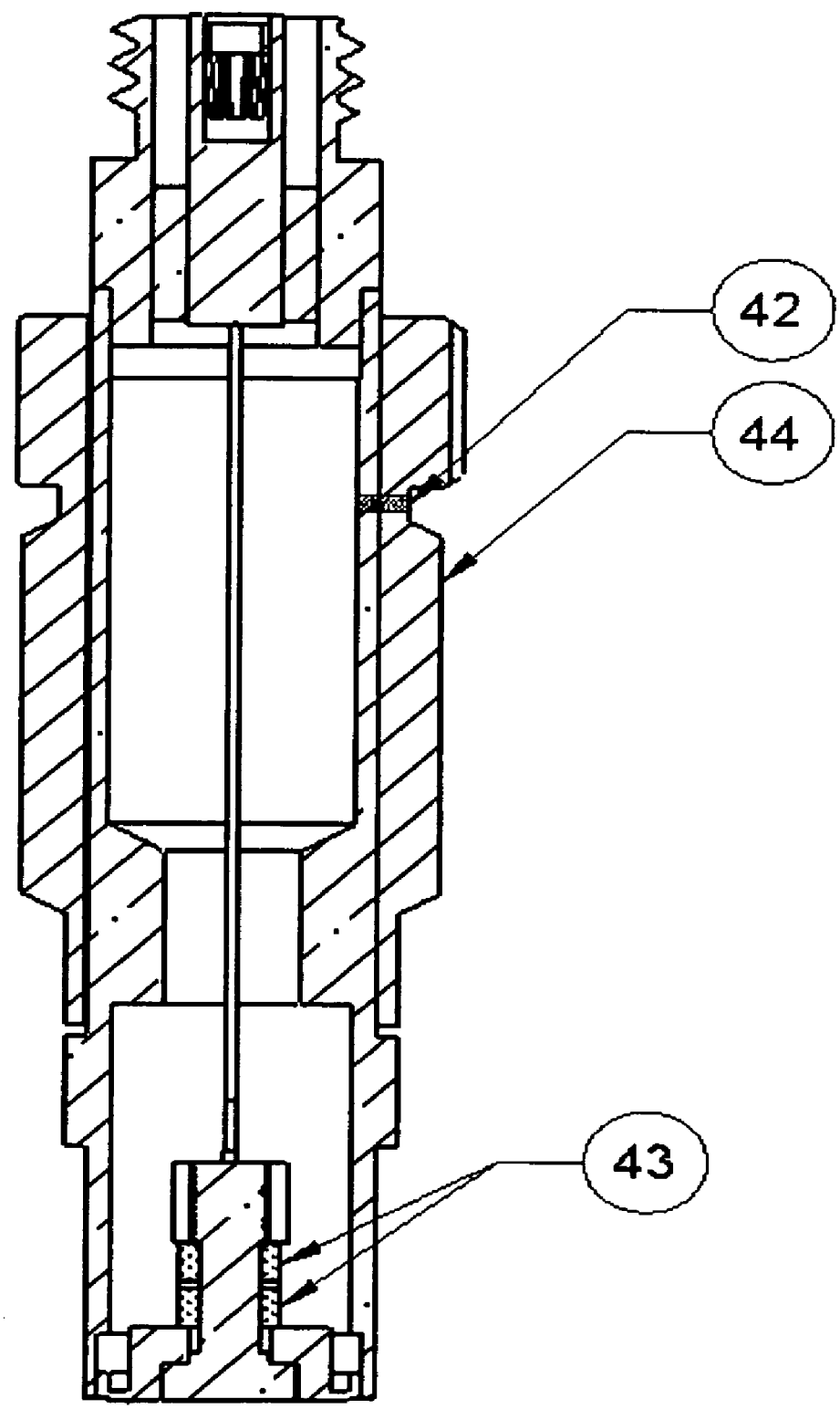
FIG. 10 is a side view in partial cross section of an exemplary piezoelectric pressure sensor with the Silver window on side.

In yet another embodiment of this invention shown in FIG. 10, a high temperature pressure sensor using piezoelectric crystals has a Silver window 42 on the side of the sensor housing. This sensor measures dynamic pressure responses at high temperatures, in combustion engines, turbines, pyrotechnics, etc. Piezoelectric elements 43 for this invention are Tourmaline, Lithium Niobate, Langatate, etc. These materials, but Tourmaline, are susceptible to Oxygen depletion in sealed environments. Oxygen depletion is a huge factor in the performance of the sensor, and the Silver window on the top of the sensor allows to keep an adequate level of Oxygen partial pressure to proper operation. Housing 44 is made with Stainless steel 304L, and the whole housing and base is grounded. In one practice of this embodiment for this invention, the entire sensor assembly was heated to a temperature approximately 1000° F., and maintained for 48 hours while the interior of the assembly was vented to the atmosphere. This sensor is hermetically sealed to a level better than $1 \times 10^{-8}$ atmosphere*cc/sec in Helium.

The foregoing description of the preferred embodiment of the invention has been presented for the purposes of illustration and description. While this invention has been particularly shown and described with reference to preferred embodiments thereof, it will be understood by those skilled in the art that various changes in form and details may be made without departing from the spirit and scope of the invention in the following claims. It is not intended to be exhaustive or to limit the invention to the precise form disclosed. Many modifications and variations are possible in light of the above teachings. It is intended that the scope of the invention be limited not with this detailed description, but rather by the claims appended hereto.

We claim:

1. A piezoelectric accelerometer sensor comprising:
   a sensor having an assembly of piezoelectric crystals, seismic mass, electrodes, connector, mounting post base, housing; and a cap with a cavity filled with Silver metal, or Silver alloys;
   a sealed environment inside the sensor separated from the external atmosphere, by Silver metal or Silver alloys; partially or completely covered;
   means for controlling the Oxygen diffusion through the Silver metal window to the piezoelectric crystals to sustain high resistivity of the elements; and
   means for activating the Oxygen diffusion through Silver metal window to the piezoelectric crystals by temperature.

2. The piezoelectric accelerometer sensor as defined in claim 1, wherein said sealed environment is formed by laser welding, E-Beam welding, TIG welding, cold welding, brazing, or any other standard welding method.

3. The piezoelectric accelerometer sensor as defined in claim 1, wherein said Silver metal window is formed by using sheet metal, machined metal, melting of the metal, plating, electroplating, deposition, or any other standard metal processing method.

4. The piezoelectric accelerometer sensor as defined in claim 1, in which the Silver window is welded, brazed, melted, or attached permanently by mechanical or chemical means.

5. The piezoelectric accelerometer sensor as defined in claim 1, in which the Silver window is oxidized, whole or partially; and inside or outside the housing.

6. The piezoelectric accelerometer sensor as defined in claim 1, wherein said sensor operates in a wide temperature range from $-459°$ F. to $+1,600°$ F.

7. A piezoelectric ultrasonic sensor comprising:
   a sensor having an assembly of piezoelectric crystals, electrodes, connector, mounting base, housing; and a cap with a cavity filled with Silver metal, or Silver alloys;
   a sealed environment inside the sensor separated from the external atmosphere, by Silver metal or Silver alloys; partially or completely covered;
   means for controlling the Oxygen diffusion through the Silver metal window to the piezoelectric crystals to sustain high resistivity of the elements; and
   means for activating the Oxygen diffusion through Silver metal window to the piezoelectric crystals by temperature.

8. The piezoelectric ultrasonic sensor as defined in claim 7, wherein said sealed environment is formed by laser welding, E-Beam welding, TIG welding, cold welding, brazing, or any other standard welding method.

9. The piezoelectric ultrasonic sensor as defined in claim 7, wherein said Silver metal window is formed by using sheet metal, machined metal, melting of the metal, plating, electroplating, deposition, or any other standard metal processing method.

10. The piezoelectric ultrasonic sensor as defined in claim 7, in which the Silver window is welded, brazed, melted, or attached permanently by mechanical or chemical means.

11. The piezoelectric ultrasonic sensor as defined in claim 7, in which the Silver window is oxidized, whole or partially; and inside or outside the housing.

12. The piezoelectric ultrasonic sensor as defined in claim 7, wherein said sensor operates in a wide temperature range from $-350°$ F. to $+1,600°$ F.

13. A sensor comprising:
    a sensor having an assembly of sensitive elements, seismic mass, electrodes, connector, mounting post base, housing; and a cap with a cavity filled with Silver metal, or Silver alloys
    a sealed environment inside the sensor separated from the external atmosphere, by Silver metal or Silver alloys; partially or completely covered;
    means for controlling the Oxygen diffusion through the Silver metal window to the piezoelectric crystals to sustain high resistivity of the elements; and
    means for activating the Oxygen diffusion through Silver metal window to the piezoelectric crystals by temperature.

14. The sensor as defined in claim 13, wherein said sealed environment is formed by laser welding, E-Beam welding, TIG welding, cold welding, brazing, or any other standard welding method.

15. The sensor as defined in claim 13, wherein said Silver metal window is formed by using sheet metal, machined metal, melting of the metal, plating, electroplating, deposition, or any other standard metal processing method.

16. The sensor as defined in claim 13, in which the Silver window is welded, brazed, melted, or attached permanently by mechanical or chemical means.

17. The sensor as defined in claim 13, in which the Silver window is oxidized, whole or partially; and inside or outside the housing.

18. The sensor as defined in claim 13, wherein said sensor operates in a wide temperature range from $-459°$ F. to $+1,600°$ F.

19. The sensor as defined in claim 13, wherein said sensor uses sensitive elements electrostrictive, pyroelectric, piezoresistive, piezoelectric, ferroelectric, relaxor, capacitive, inductive, resistive, strain gage, superconductor, or photosensitive.

20. The sensor as defined in claim 13, wherein said sensor measures pressure, force, acceleration, strain, flow, magnetism, ultrasonic waves, frequency, acoustic emission, displacement, velocity, or orientation.

* * * * *